United States Patent [19]

Dyce et al.

[11] 4,209,893
[45] Jul. 1, 1980

[54] SOLDER PACK AND METHOD OF MANUFACTURE THEREOF

[75] Inventors: John W. Dyce, Sidney; Ronald F. Buczak, Poughkeepsie, both of N.Y.

[73] Assignee: The Bendix Corporation, Southfield, Mich.

[21] Appl. No.: 954,267

[22] Filed: Oct. 24, 1978

[51] Int. Cl.³ ............................................. B23P 11/02
[52] U.S. Cl. .................................. 29/522 R; 228/56; 206/329; 206/486
[58] Field of Search ................ 228/56, 245, 246, 255; 29/626, 783, 788, 790, 522; 206/486, 329, 328

[56] References Cited

U.S. PATENT DOCUMENTS

| | | | |
|---|---|---|---|
| 3,396,894 | 8/1966 | Ellis | 228/56 |
| 3,472,365 | 10/1969 | Tiedema | 228/56 X |
| 3,744,129 | 7/1973 | Dewey, Jr. | 228/56 X |
| 4,099,615 | 7/1978 | Lemke et al. | 206/329 |
| 4,142,286 | 3/1979 | Knuth et al. | 29/626 |

*Primary Examiner*—Milton S. Mehr
*Assistant Examiner*—K. J. Ramsey
*Attorney, Agent, or Firm*—William G. Christoforo; C. Dennis Lacina; Raymond J. Eifler

[57] ABSTRACT

A solder pack consists of a thin heat resistant carrier board having spaced holes therethrough in which are held solder rings. The solder pack is, for example, placed over pins supported in correspondingly spaced holes in a printed circuit board so that each pin protrudes through an associated solder ring in the solder pack. Heat is applied to melt the solder rings to solder the pins to the printed circuit board. Two representative means for manufacturing solder packs are disclosed.

2 Claims, 3 Drawing Figures

SOLDER PACK AND METHOD OF MANUFACTURE THEREOF

FIELD OF THE INVENTION

This invention relates to soldering apparatus and more particularly to soldering apparatus which permits a plurality of soldering operations to be performed simultaneously.

BACKGROUND OF THE INVENTION

Soldering rings have been used in various fields for some time. Generally, a soldering ring, which is simply a preformed ring or solder material having a center hole which is sized to fit the item to be soldered, is slipped over the item to be soldered, which is usually cylindrical and which has been prepositioned in the item to which it is to be soldered, usually in a hole therein so that the item to be soldered is loosely supported in the item to which it is to be soldered. Basically, the item to be soldered, the item to which it is to be soldered, and the solder ring meet at the surface or joint at which the soldering is to occur. A suitable flux having been provided, heat is applied to the solder joint by a suitable means such as a heat gun or lamp or by heating the solder joint in an oven so as to melt the solder ring and complete the solder joint.

In the electrical connector field the items to be soldered and the item to which they are soldered usually comprise connector pins and a printed circuit board, respectively, with the pins being supported, before soldering, in appropriate printed circuit board holes where a printed circuit about the hole and its associated pin will comprise the solder joint. A solder ring is assembled over each pin and heat applied to complete the solder joints.

SUMMARY OF THE INVENTION

According to the present invention a solder pack is comprised of a relatively thin heat resistant carrier pack having spaced holes therein arranged to match the spacing of items to be soldered. Each hole holds a solder ring. The solder pack is intended to be placed over the items to be soldered, with each solder ring surrounding its associated item. Heat is applied to melt the various solder rings which flow out of the holes in the carrier pack to form a plurality of desired solder joints. The empty carrier pack is then removed and discarded or recycled.

Two means for manufacturing solder packs are shown. The first comprises a hole punch and die set, a solder ball feed, drive and press rollers and a center hole punch and die set. A roll of carrier pack material is stored on a spool and drawn continuously by the drive and press rollers first through the hole punch and die set wherein appropriate holes in the carrier pack material are punched. The punched carrier pack material is then fed through the solder ball feed where each punched hole picks up a solder ball. The solder balls are than flattened between the drive and press rollers into the various holes, forming solder discs in the holes. The center hole punch and die set then removes the center section from each solder disc to leave solder rings and suitably cuts the carrier pack material to form a solder pack.

According to the second means for manufacturing solder packs, a preformed and punched carrier pack is placed on a traveling holding jig which includes a plurality of pins with each pin protruding through an associated hole in the carrier pack. The holding jig and carrier pack are moved through a solder ring magazine by a pressure roller, wherein solder rings are dropped over the pins and into the various solder pack holes. The pins are forced down so that the ends are flush with or below the top surface of the carrier pack. The solder rings are then compressed into the carrier pack holes by the pressure roller.

It is an object of this invention to provide a solder pack which permits a plurality of solder rings to be assembled on items to be soldered simultaneously.

Another object of the invention is to provide means for manufacturing the above mentioned solder packs.

These and other objects of the invention will become apparent with a reading and understanding of the following description.

BRIEF DESCRIPTION OF THE DRAWINGS

FIG. 3 shows in schematic form another means for manufacturing solder packs.

DESCRIPTION OF THE PREFERRED EMBODIMENT

Figure 1:
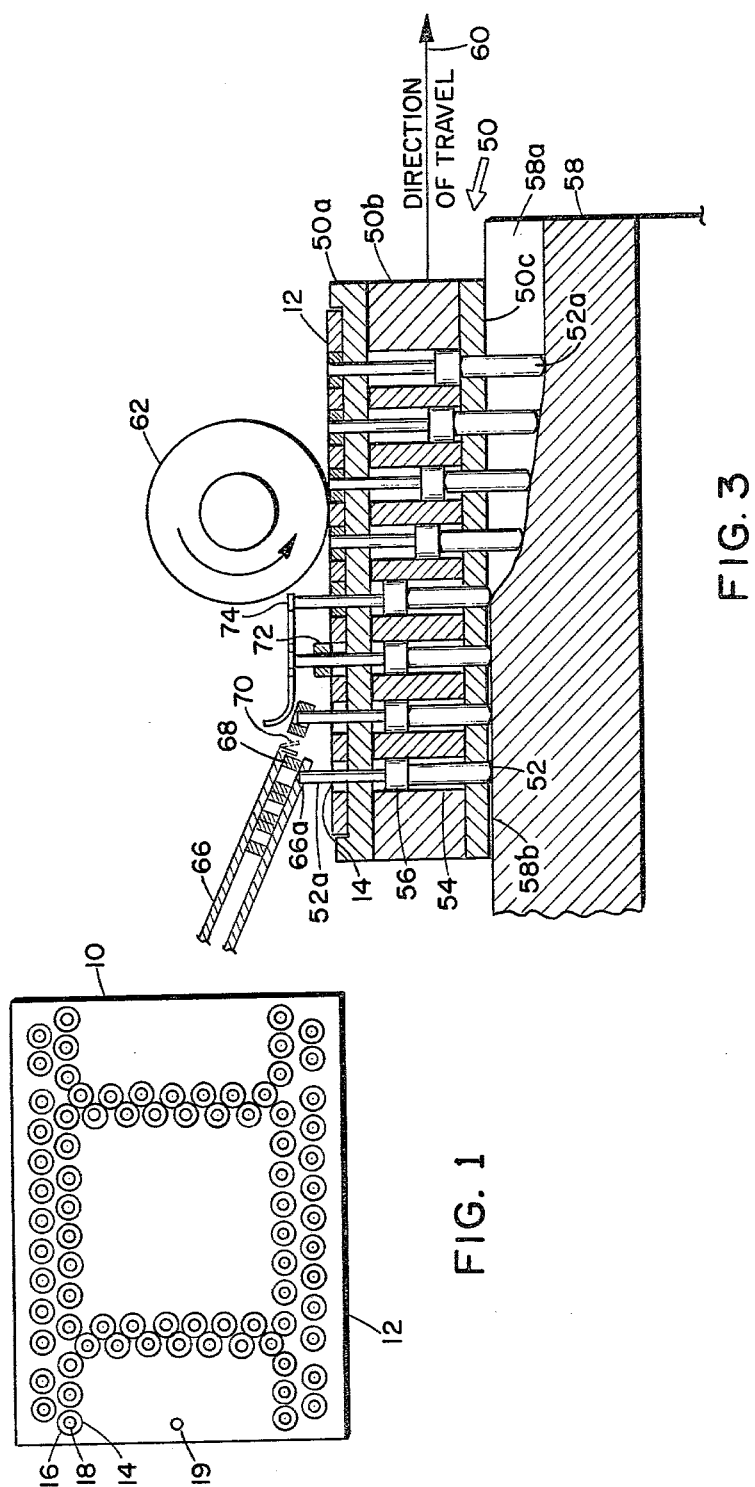
FIG. 1 shows a solder pack made according to the principles of this invention.

Referring first to FIG. 1, a solder pack made in accordance with the principles of the present invention is comprised of a heat resistant carrier pack board 12 having a plurality of spaced holes therein, a representative hole being designated at 14 and an optional locating hole 19, more of which will be said below. Each hole has snugly assembled therein a solder ring 16 having a central hole 18 therethrough.

Figure 2:
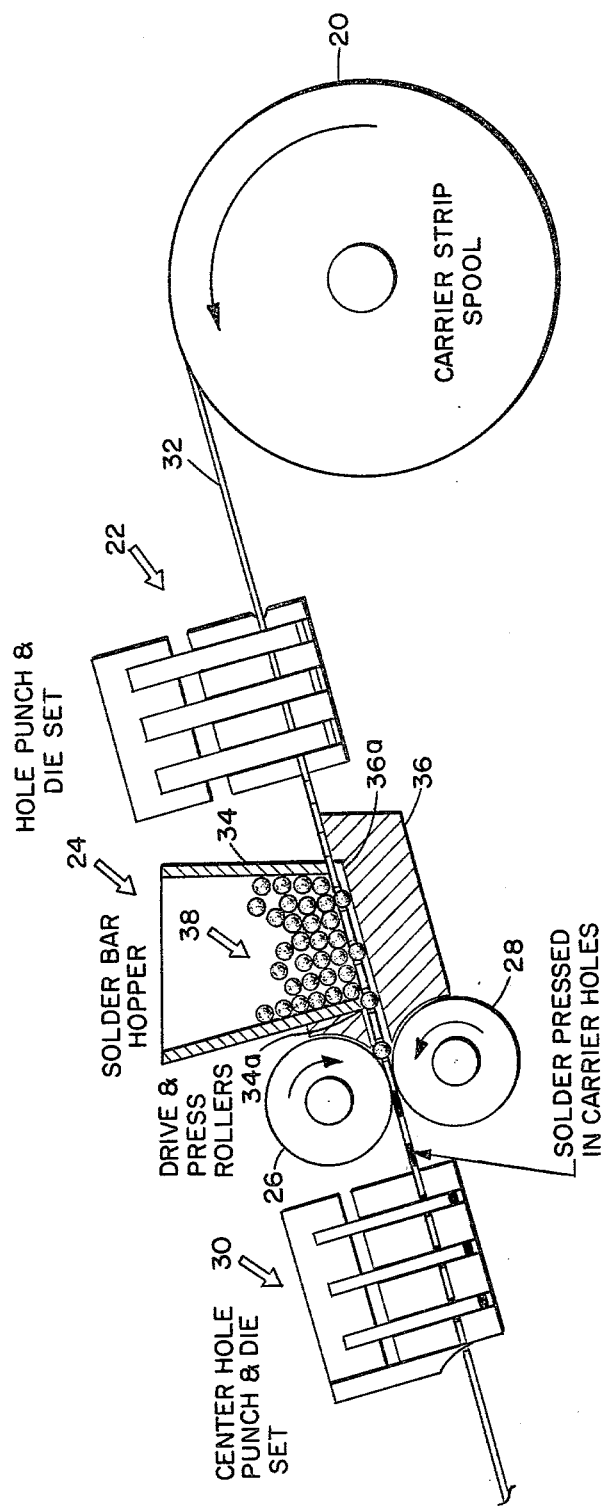
FIG. 2 shows in schematic form a means for manufacturing solder packs.

A suitable heat resistance material for the carrier board is Kapton, which is a registered trademark of the E. I. DuPont deNemours & Company of Wilmington, Del., U.S.A. A suitable carrier board thickness is 0.010 to 0.015 inch. Kapton in such thickness is available as a continuous strip wound on a carrier strip spool such as shown at 20 in FIG. 2, reference to which figure should now be made. That figure shows a first means for manufacturing solder packs. According to FIG. 2, the Kapton strip material is drawn from spool 20 continuously in succession through a hole punch and die set 22, a solder ball hopper 24, drive and press rollers 26, 28 and center hole punch and die set 30. The motive force for moving the Kapton strip through the various elements of the manufacturing means is provided by rollers 26 and 28 which, in turn, are powered by conventional means (not shown).

The holes 14 of FIG. 1 are punched into the Kapton strip 32 issuing from spool 20 by the hole punch and die set 22. It should be understood that the hole punch and die set 22 is a conventional element of the type known to those skilled in the art and produces a predetermined hole pattern and spacings on the Kapton strip at intervals where the hole pattern and spacings correspond to the items to be soldered with the resulting solder punch. In addition, hole punch and die set 22 punches an optional locating hole 19 (FIG. 1) in carrier pack strip 32 where the position of hole 19 is, of course, fixed with respect to holes 14.

The punched strip is then drawn through solder ball hopper 24 which consists of an open bottom solder ball storage chute 34 and an underlying strip guide 36. More particularly, the punched strip is fed between the open bottom chute 34 and guide 36. A plurality of solder balls 38 of the conventional type are stored in chute 34 and drop individually into holes 14 as the punched strip moves therethrough. A recess 36a in guide 36 permits the solder balls to be roughly centered with respect to the longitudinal axis of strip 32 so that they are easily carried in holes 14 as the strip moves.

Strip 32 with a solder ball in each hole 14 passes under chute threshold 34a which comprises a cut away in the forward bottom edge of chute 34 of sufficient height to permit solder balls in holes 14 to pass out of chute 34 as shown. Returning to FIG. 1, locating hole 19 in strip 32 punched at the same time as holes 14 is smaller than the diameter of a solder ball 38 so that solder balls do not enter therein but rather sit above strip 32 with the result that they cannot pass under threshold 34a. Strip 32 thus issues from threshold 34a with a solder ball 38 in each hole 14 but with hole 19 empty. Strip 32 is drawn through drive and press rollers 26 which are driven by a conventional roller drive mechanism (not shown). As is to be expected, only one roller, for example roller 26, need be driven if spring biased against an idling support roller such as roller 28. In addition to rollers 26 and 28 supplying the motive force for strip 32 they also compress the solder balls into holes 14 between them so that the solder balls are deformed snugly into holes 14 to form discs which are generally coextensive with the holes. Strip 32 thus issues from the drive and press rollers with hole 19 empty and each hole 14 filled with a solder disc.

Center hole punch and die set is of the conventional type which can include a conventional locating pin which is suitably spring biased down so as to find hole 19 and powered up after the hole punching operation is performed as described below. As should be obvious and as is conventional in the art, the pattern of holes 14 must be located with respect to center hole punch and die set 30 in the same manner as it was located with respect to hole punch and die set 22. This can be easily accomplished by locating strip 32 against a fixed side rail, suitably by spring biasing, and with the aforementioned locating pin in hole 19. For this method of locating strip 32 and the pattern comprised of holes 14 with respect to center hole punch and die set 30 a similar side rail and biasing means is installed at hole punch and die set 22 to provide the location reference. In my event, the means for locating a work piece in various serially arranged dies is well known in the art and do not comprise the invention here and thus are not described in great detail.

When the locating pin drops into hole 19 a circuit (not shown) is energized to cause punch and die set 30 to punch center holes 18 into each solder disc. In addition, a die cuts carrier board 12 (FIG. 1) from strip 32 thus producing a finished solder pack 12. Immediately thereafter the locating pin is retracted. It is preferable that hole punch and die set 22 be activated to punch holes 14 and 19 at the same time center hole punch and die set 30 is activated. This can be accomplished by using the same means to activate both die sets. In this regard, it may be necessary to activate hole punch and die set 22 independently during initial set up of the device of FIG. 2.

It is also preferable that roller 26 be powered continuously since the stroking of the various die sets is rapid and the spacing thereof provides the necessary "give" in strip 32 to prevent tearing of the Kapton material. Alternately, roller 26 can be stopped during the stroking of the die sets by the same means that causes the stroking.

Another means of producing solder packs is shown in FIG. 3, reference to which figure should now be made. According to this means a prepunched carrier pack board 12 having holes 14 therein is loaded onto a traveling holding fixture 50 having a plurality of pins, for example pin 52, associated with and extending through each hole 14. Each pin 52 is loosely guided in a fixture bore such as bore 54 in a center structure 50b of fixture 50. A collar 56 captivates pin 52 within fixture 50 between fixture top and bottom plates 50a and 50c. Fixture 50 and carrier pack board 12 are moved along the surface of a stationary base plate 58 by pressure roller 62, driven by means not shown. Base plate 58 at the portion 58b thereof causes pins 52 to be forced upward so that the end 52a thereof extends above carrier board 12. As the fixture and board pass under a solder ring magazine tube 66, loaded with solder rings 68, each pin and 52a captures a solder ring at the bore thereof and forces it out of magazine tube 66 through spring gate 70 so that the solder ring eventually falls against board 12 as shown at position 72. This operation can be assisted by a fixed rail 74. Note that magazine tube 66 is cut-away at 66a to permit access of pin end 52a to the hole in solder ring 68. It should also be understood that a plurality of magazine tubes 66 is provided, one for each column of holes 14 in carrier pack 12. If the columns are spaced too closely to one another, magazine tubes 66 can be staggered.

As fixture 50 moves in the direction of arrow 60, pins 52 are allowed to drop into recess 58a in base plate 58, thus permitting solder rings 68 to be snugly, deformed and compressed by pressure roller 62 into holes 14 against top plate 50a.

Having described our solder pack and various means by which it can be manufactured, certain alterations and modifications should now suggest themselves to the reader. Accordingly, we intend our property to extend to the true spirit and scope of the appended claims.

We claim:

1. The method of manufacturing a solder pack comprising:

providing a continuous strip of heat resistant material;

advancing the strip and simultaneously providing a predetermined pattern of through holes in the material;

dropping a preform of solder material into each hole, the volume of each preform being slightly in excess of the volume of the hole in which dropped;

compressively deforming the preform of solder material in each hole so that the preform is forced against the sides of each hole to form a solder disc, each disc being coextensive with the top and bottom surfaces of the strip and held snugly in each hole;

advancing the strip and simultaneously providing an aperture in a central portion of each solder disc; and advancing the strip and simultaneously cutting the strip into the solder pack.

2. The method of claim 1 wherein the preform of solder material is in the form of a solder ball and wherein the deforming step comprises compressing each solder ball so that it flattens to conform with the bounds of the hole and is forced against the side of the hole in which it is dropped.

* * * * *